US009115619B2

(12) United States Patent
An et al.

(10) Patent No.: US 9,115,619 B2
(45) Date of Patent: Aug. 25, 2015

(54) THERMOELECTRIC GENERATOR OF VEHICLE

(71) Applicants: Hyundai Motor Company, Seoul (KR); Kia Motors Corporation, Seoul (KR)

(72) Inventors: Ho-Chan An, Hwasung-shi (KR); Jong-Ho Seon, Incheon-shi (KR); Ho-Cheol Seo, Ulsan (KR); Sung-Ool Jang, Suwon (KR)

(73) Assignees: HYUNDAI MOTOR COMPANY, Seoul (KR); KIA MOTORS CORPORATION, Seoul (KR); SEJONG IND. CO. LTD., Ulsan (KR)

( * ) Notice: Subject to any disclaimer, the term of this patent is extended or adjusted under 35 U.S.C. 154(b) by 333 days.

(21) Appl. No.: 13/688,971

(22) Filed: Nov. 29, 2012

(65) Prior Publication Data

US 2013/0160434 A1    Jun. 27, 2013

(30) Foreign Application Priority Data

Dec. 23, 2011    (KR) .......................... 10-2011-141320

(51) Int. Cl.
*H01L 35/30*   (2006.01)
*F01N 5/02*    (2006.01)
*H01L 35/32*   (2006.01)

(52) U.S. Cl.
CPC .............. *F01N 5/025* (2013.01); *H01L 35/32* (2013.01); *Y02T 10/16* (2013.01)

(58) Field of Classification Search
CPC ......... H01L 35/30; H01L 35/32; H01L 23/40; H01L 23/473; H01L 23/4006; G01N 5/025
USPC ................................................... 60/320, 321
See application file for complete search history.

(56) References Cited

U.S. PATENT DOCUMENTS

2011/0120106 A1    5/2011 Brueck et al.

FOREIGN PATENT DOCUMENTS

| JP | 2006-314180 A | 11/2006 |
| JP | 2009-33806 A | 2/2009 |
| KR | 2002-0037964 A | 5/2002 |

*Primary Examiner* — Audrey K Bradley
*Assistant Examiner* — Jonathan Matthias
(74) *Attorney, Agent, or Firm* — Morgan, Lewis & Bockius LLP

(57) ABSTRACT

A thermoelectric generator of a vehicle converts thermal energy of exhaust gas of an engine into electric energy by using a thermoelectric phenomenon, and may include: a high-temperature part heated by exchange heat and a plurality of pairs of heat transfer plates mounted on an outer peripheral surface of an exhaust pipe at a predetermined interval; pairs of thermoelectric modules acquired by bonding a P-type semiconductor and an N-type semiconductor, interposed between the pairs of heat transfer plates to generate electricity, and electrically connected to each other; and a low-temperature part interposed between the pairs of thermoelectric modules and cooling inner surfaces of the pairs of thermoelectric modules. The plurality of thermoelectric modules generates electricity by a difference in temperature between heated outer surfaces and cooled inner surfaces. Thermoelectric efficiency is improved and a small-sized thermoelectric generator of a vehicle may be implemented.

6 Claims, 7 Drawing Sheets

A-A'

B-B'

(a)

(b)

(c)

(d)

(e)

THERMOELECTRIC GENERATOR OF VEHICLE

CROSS-REFERENCE TO RELATED APPLICATIONS

The present application claims priority of Korean Patent Application Number 10-2011-141320 filed Dec. 23, 2011, the entire contents of which application is incorporated herein for all purposes by this reference.

BACKGROUND OF INVENTION

1. Field of Invention

The present invention relates to a thermoelectric generator, and more particularly, to a thermoelectric generator of a vehicle that generates power by using heat of exhaust gas of the vehicle.

2. Description of Related Art

A thermoelectric element refers to an element using a thermoelectric phenomenon in which a difference in temperature between both ends of the element is converted into electricity to convert thermal energy into electric energy or the difference in temperature between both ends of the element is caused by making electricity flow on the element to convert the electric energy into the thermal energy. The thermoelectric element is used in a small-scale cooling device, a small-scale heating device, or a small-scale power generating device.

The thermoelectric element used in the small-scale power generating device is called a thermoelectric generating device or a thermoelectric generator. The thermoelectric generator is primarily used in a power supply device of a radio communicator, a power supply device of a spaceship, a power supply device of a nuclear-powered submarine, and a thermoelectric generator installed in an exhaust system of a vehicle.

FIG. 1 is a cross-sectional view illustrating a thermoelectric generator of a vehicle.

As illustrated in the figure, a thermoelectric generator 10 installed in the exhaust system of the vehicle includes a hexagonal exhaust heat recovering device 40 through which high-temperature exhaust gas passes, a cooling device 30 installed outside the exhaust heat recovering device 40, through which cooling water passes therein, and a plurality of thermoelectric modules 20 generating electricity by a difference in temperature between both ends by contacting the outside of the exhaust heat recovering device 40 and the inside of the cooling device 30.

The thermal energy is transferred to the thermoelectric module 20 while the high-temperature exhaust gas flows in the exhaust heat recovering device 40. A cooling pipe 32 in which the cooling water flows is formed in the cooling device 30 to increase a difference in temperature between the inside of the thermoelectric module 20 contacting the exhaust heat recovering device 40 and the outside of the thermoelectric module 20 contacting the cooling device 30. As such, efficiency of the thermoelectric generator installed in the exhaust system of the vehicle is increased by increasing the difference in temperature between the inside and the outside of the thermoelectric module 20.

The information disclosed in this Background section is only for enhancement of understanding of the general background of the invention and should not be taken as an acknowledgement or any form of suggestion that this information forms the prior art already known to a person skilled in the art.

SUMMARY OF INVENTION

In order to produce a lot of electricity in a thermoelectric generator, that is, in order to increase thermoelectric generation efficiency, thermal energy of exhaust gas needs to be efficiently transferred to the thermoelectric module. However, in the thermoelectric generator of the vehicle in the related art, since the thermal energy of the exhaust gas is not sufficiently transferred to a high-temperature part, a recovery ability of the thermal energy of the exhaust gas deteriorates, and as a result, thermoelectric efficiency of the thermoelectric generator deteriorates.

Further, the thermoelectric generator of the vehicle in the related art is low in thermoelectric generation efficiency compared to a size thereof because a heat exchange dimension is small, and thus a heat transfer rate is low, even though the cooling device 30 occupies a large dimension.

Accordingly, the present invention attempts to solve the problems of the related art and provides a thermoelectric generator of a vehicle which is small and has improved thermoelectric generation efficiency.

Various aspects of the present invention provide for a thermoelectric generator of a vehicle including: a high-temperature part including an exhaust pipe heated by exchange heat with exhaust gas while high-temperature exhaust gas passes therein and a plurality of pairs of heat transfer plates mounted on an outer peripheral surface of the exhaust pipe at a predetermined interval and heated by the exhaust pipe; a plurality of pairs of thermoelectric modules acquired by bonding a P-type semiconductor and an N-type semiconductor, interposed between the plurality of pairs of heat transfer plates to generate electricity by using a thermoelectric phenomenon, and electrically connected to each other; and a low-temperature part interposed between the plurality of pairs of thermoelectric modules and cooling inner surfaces of the plurality of pairs of thermoelectric modules by cooling water that flows therein, and the plurality of thermoelectric modules generates electricity by using the thermoelectric phenomenon by a difference in temperature between outer surfaces heated by the heat transfer plate and inner surfaces cooled by the low-temperature part.

The low-temperature part may include: a plurality of circular cooling water passages interposed between the plurality of pairs of thermoelectric modules, in which the cooling water flows therein, and having a cooling water inlet through which the cooling water is introduced, which is formed at one side of one surface and a cooling water outlet through which the cooling water is discharged, which is formed at one side of the other surface; and a cooling water passage connecting unit connecting the cooling water inlet of an adjacent cooling water passage and the cooling water outlet of the other adjacent cooling water passage among the plurality of cooling water passages.

The cooling water passage connecting unit may include: a hose mounted on outer peripheral surfaces of the cooling water inlet and the cooling water outlet; and a clamp pressing the hose.

The cooling water passage connecting unit may be acquired by welding the cooling water inlet of one adjacent cooling water passage and the cooling water outlet of the other one adjacent cooling water passage.

The cooling water passage connecting unit may include: a left-handed screw formed at the cooling water inlet of one adjacent cooling water passage; a right-handed screw formed at the cooling water outlet of the other one adjacent cooling water passage; and a connection nut connecting the cooling water inlet and the cooling water outlet by screw-coupling.

The cooling water passage connecting unit may include a press sealing interposed between the cooling water outlet of the other one adjacent cooling water passage having a larger diameter than the cooling water inlet of one adjacent cooling water passage.

The cooling water passage connecting unit may include a fitting union connecting the cooling water inlet of one adjacent cooling water passage and the cooling water outlet of the other one adjacent cooling water passage.

According to the thermoelectric generator of the vehicle of the present invention, even though a dimension of the exhaust gas contacting the thermoelectric module is large, the overall size of the thermoelectric generator is small.

Since a structure is simple and the number of parts is small, a manufacturing cost is reduced and productivity is improved.

The size of the thermoelectric generator of the vehicle of the present invention is small, and as a result, the thermoelectric generator is easily mounted on a vehicle package and can be applied to various vehicles.

A heat-exchange mesh may be installed between the high-temperature part and the thermoelectric module to increase the contact dimension with the exhaust gas, and as a result, the thermal energy of the exhaust gas is more efficiently transferred to the thermoelectric module and noise of the exhaust gas passing through the thermoelectric module is also reduced.

The methods and apparatuses of the present invention have other features and advantages which will be apparent from or are set forth in more detail in the accompanying drawings, which are incorporated herein, and the following Detailed Description, which together serve to explain certain principles of the present invention.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

Figure 1:
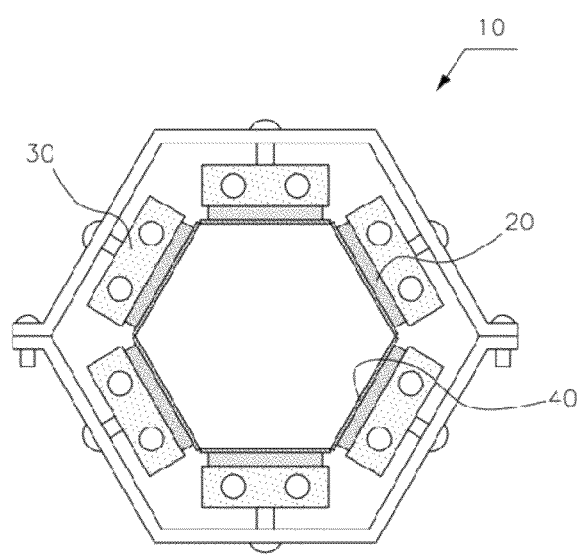
FIG. 1 is a cross-sectional view illustrating a thermoelectric generator of a vehicle in the related art.
Figure 2:
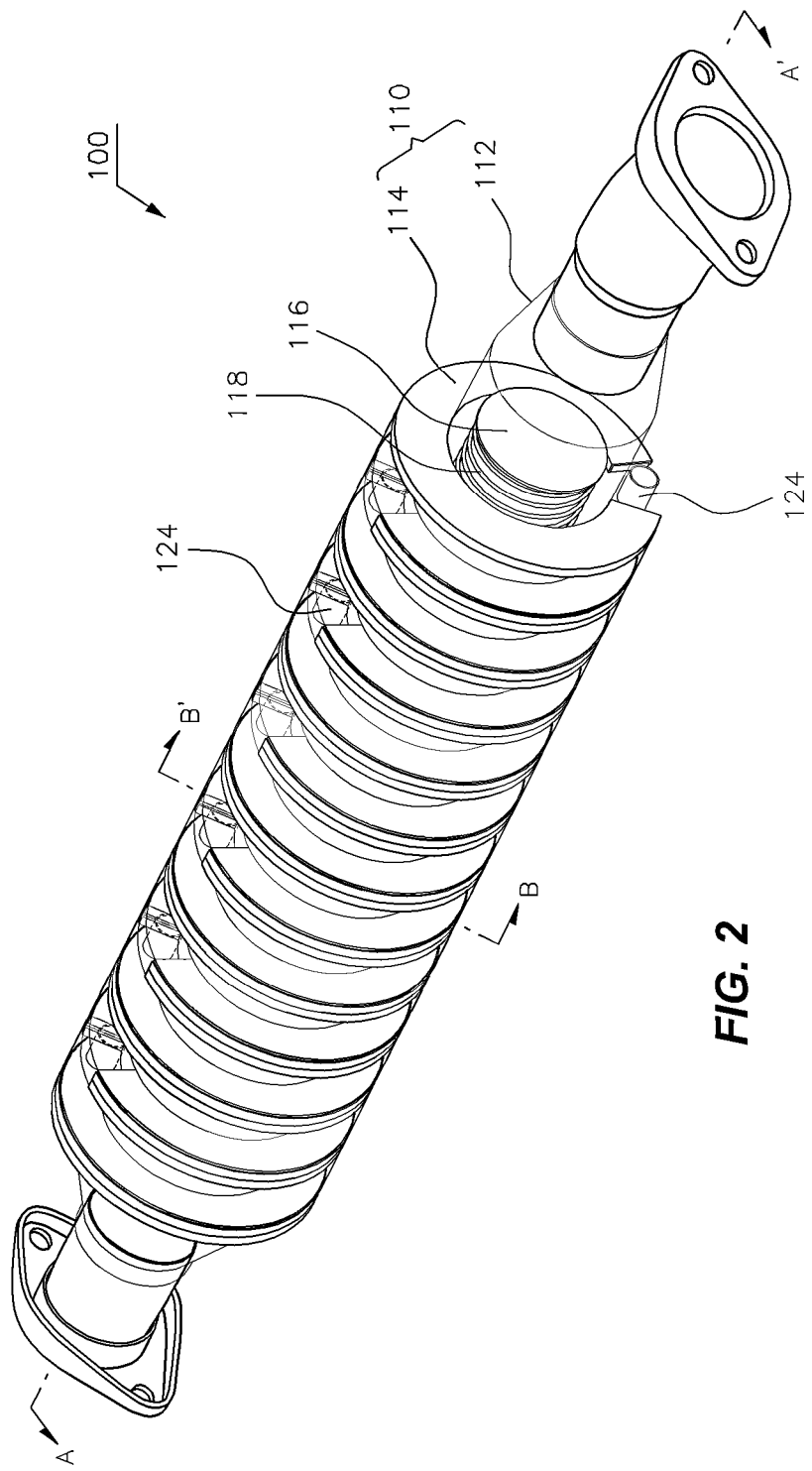
FIG. 2 is a perspective view illustrating an exemplary thermoelectric generator of a vehicle according to the present invention.
Figure 3:
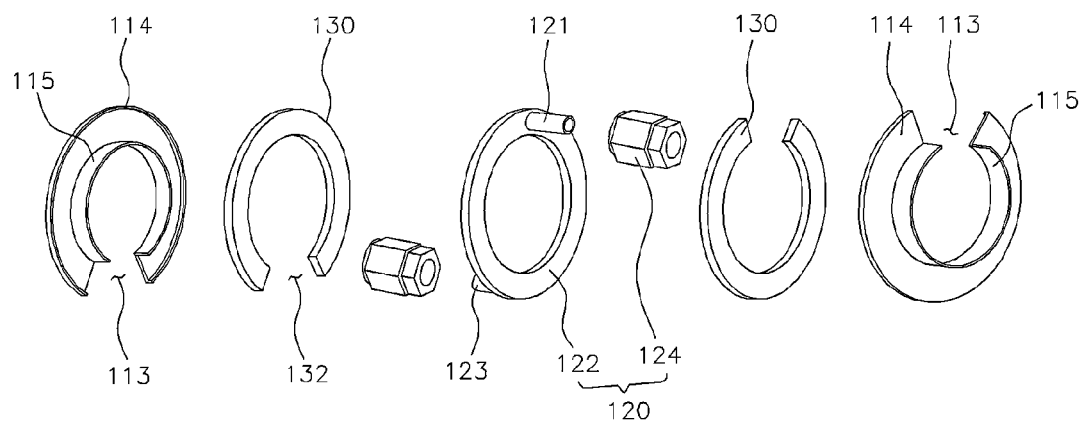
FIG. 3 is an exploded perspective view of a high-temperature part, a thermoelectric module, and a low-temperature part of an exemplary thermoelectric generator of the vehicle according to the present invention.
Figure 4:
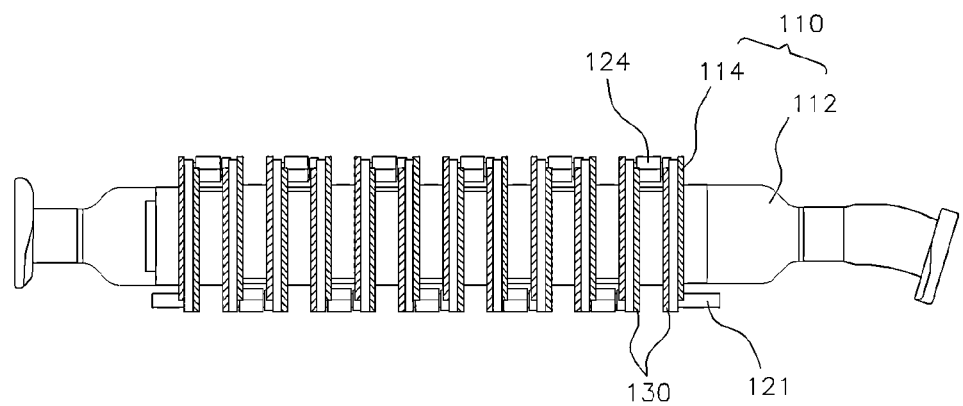
FIG. 4 is a cross-sectional view taken along line A-A' of FIG. 2 and illustrates a state in which the high-temperature part, the thermoelectric module, and the low-temperature part are coupled.
Figure 5:
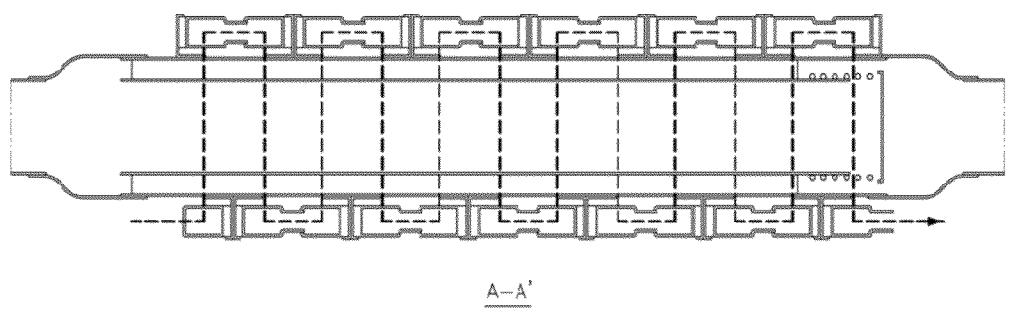
FIG. 5 is a cross-sectional view taken along line A-A' of FIG. 2 and illustrates the flow of cooling water that flows in the low-temperature part.
Figure 6:
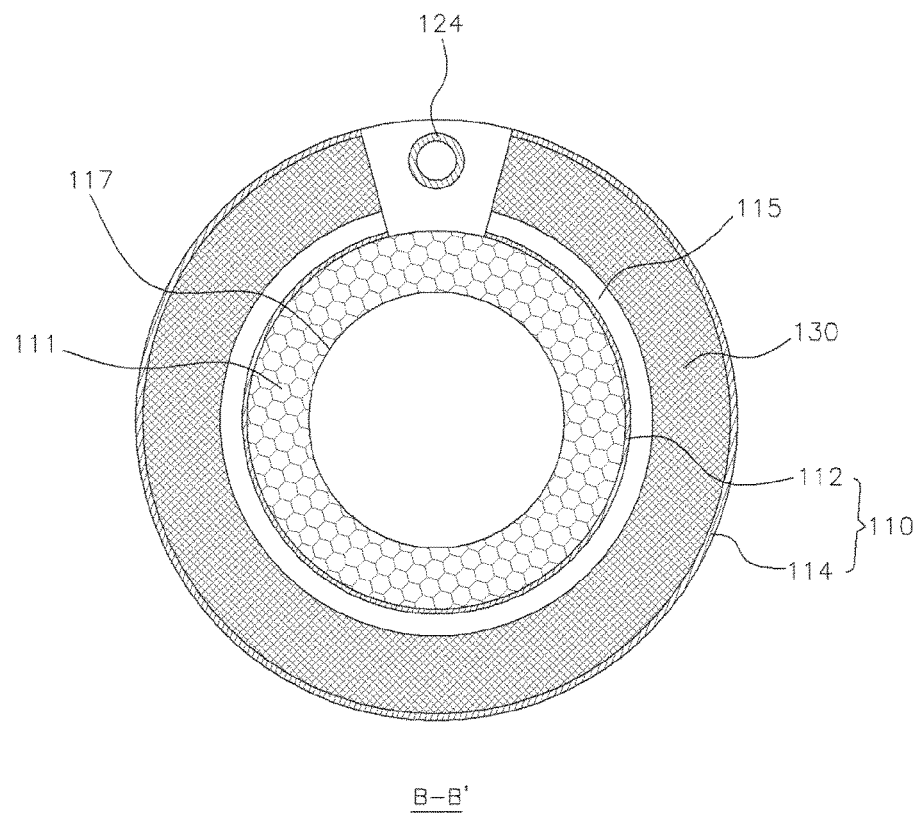
FIG. 6 is a cross-sectional view taken along line B-B' of FIG. 2.

FIG. 2 is a perspective view illustrating a thermoelectric generator of a vehicle according to various embodiments of the present invention. FIG. 3 is an exploded perspective view of a high-temperature part, a thermoelectric module, and a low-temperature part of the thermoelectric generator of the vehicle according to various embodiments of the present invention. FIG. 4 is a cross-sectional view taken along line A-A' of FIG. 2 and illustrates a state in which the high-temperature part, the thermoelectric module, and the low-temperature part are coupled. FIG. 5 is a cross-sectional view taken along line A-A' of FIG. 2 and illustrates the flow of cooling water that flows in the low-temperature part. FIG. 6 is a cross-sectional view taken along line B-B' of FIG. 2. FIGS. 7A, 7B, 7C, 7D and 7E are cross-sectional view illustrating various examples of a cooling water passage connecting unit of the thermoelectric generator according to various embodiments of the present invention.

As illustrated in the figure, a thermoelectric generator 100 of a vehicle according to various embodiments of the present invention includes a high-temperature part 110 heated by exchanging heat with high-temperature exhaust gas discharged from an engine, a low-temperature part 120 in which cooling water circulated by a cooling system of the engine flows, and which is installed outside the high-temperature part 110, and a thermoelectric module 130 interposed between the high-temperature part 110 and the low-temperature part 120 to generate electricity by using a thermoelectric phenomenon by a difference in temperature between the high-temperature part 110 and the low-temperature part 120.

The high-temperature part 110 includes an exhaust pipe 112 heated while the high-temperature exhaust gas passes therein and a plurality of pairs of donut-shaped heat transfer plates 114 installed on an outer peripheral surface of the exhaust pipe at a predetermined interval.

Each of the heat transfer plates 114 extends on an inner peripheral surface in a longitudinal direction and includes a flange 115 contacting the outer peripheral surface of the exhaust pipe 112 and an opening portion 113 formed at one side, as illustrated in FIG. 3. The flange 115 transfers thermal energy of exhaust gas to the heat transfer plate 114 through the exhaust pipe 112.

The exhaust pipe 112 has a hollow cylindrical shape and is heated by the high-temperature exhaust gas which flows therein. The exhaust pipe 112 heated as above heats the heat transfer plates 114 installed on the outer peripheral surface thereof. A bypass pipe 117 where the exhaust gas is bypassed is installed in the exhaust pipe 112. A bypass valve 116 that opens/closes a terminal of the bypass pipe 117 is mounted on the terminal of the bypass pipe 117 in order to bypass the exhaust gas according to a load of the engine. The bypass valve 116 is elastically supported on the bypass pipe 117 by a spring 118. A plurality of exhaust holes where the exhaust gas flows is formed in the upstream of the bypass pipe 117 when the bypass valve 116 is closed.

A heat-exchange mesh 111 is interposed between the outer peripheral surface of the bypass pipe 117 and the inner peripheral surface of the exhaust pipe 112. The heat-exchange mesh 111 exchanges heat with the high-temperature exhaust gas to absorb the thermal energy of the exhaust gas and transfer the absorbed heat energy to the exhaust pipe 112.

That is, the thermal energy of the exhaust gas is efficiently transferred to the exhaust pipe 112 by the heat-exchange mesh 111.

When the vehicle is driven at a high speed, that is, when the load of the engine is increased, the exhaust pipe may be overheated. In order to prevent the overheat of the exhaust pipe, when the engine is in a high load, the bypass valve 116 is opened and most of the high-temperature exhaust gas is exhausted through the bypass pipe 117, and as a result, the amount of exhaust gas that flows between the bypass pipe 117 and the exhaust pipe 112 is controlled.

The low-temperature part 120 is positioned between the plurality of pairs of heat transfer plates 114 of the high-temperature part 110. The low-temperature part 120 includes a plurality of circular cooling water passages 122 interposed between the plurality of pairs of heat transfer plates 114 and a plurality of cooling water passage connecting units 124 alternately connecting the plurality of circular cooling water passages 122 at every 180°.

As illustrated in FIG. 3, each of the plurality of cooling water passages 122 includes a cooling water inlet 121 formed at one surface and one side, through which cooling water circulated by a cooling system of the engine is introduced and a cooling water outlet 123 formed in a diagonal direction at an opposite surface to the cooling water inlet 121, through which the cooling water is discharged. The plurality of cooling water passages 122 is connected to each other in such a manner that the cooling water inlet 121 of one cooling water passage 122 and the cooling water outlet 123 of the other one cooling water passage 122 are connected to each other in a longitudinal direction by using the cooling water passage connecting unit 124. That is, three cooling water passages 122 adjacent to each other are connected to each other by the cooling water passage connecting unit 124 in a state in which the cooling water outlets 123 and the cooling water inlets 121 of two cooling water passages 122 adjacent to each other are first positioned in the same direction. Another cooling water passage 122 which has not yet been connected is connected by the cooling water passage connecting unit 124 with the corresponding cooling water passage 122 rotated at 180° from the cooling water inlet 121 and the cooling water outlet 123 of the cooling water passage 122 which has already been connected, that is, at an opposite side to a center line of the cooling water passage 122. The cooling water passages 122 connected as above are illustrated in FIGS. 4 and 5.

As described above, when the cooling water passages 122 are connected, the cooling water flows in zigzag according to the center line of the exhaust pipe 112, as illustrated in FIG. 5. A method of connecting the cooling water inlet 121 and the cooling water outlet 123 is various and an example thereof is illustrated beginning in FIG. 7A.

Figure 7A:
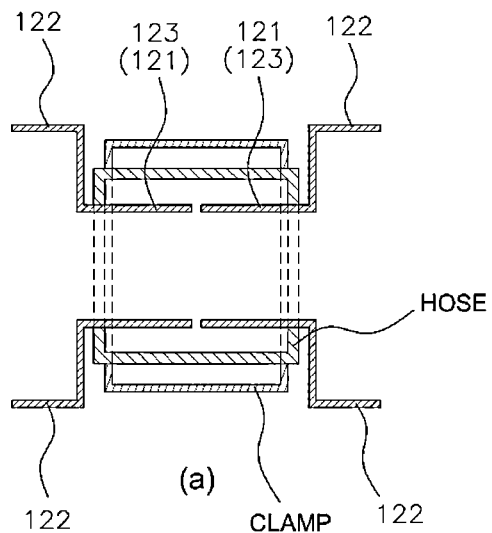
FIGS. 7A, 7B, 7C, 7D and 7E are cross-sectional views illustrating various examples of a cooling water passage connecting unit of an exemplary thermoelectric generator according to the present invention.

FIG. 7(A) illustrates a connection method by a hose. FIG. 6(A) illustrates a method of inserting the cooling water inlet 121 and the cooling water outlet 123 of the cooling water passage 122 into the hose and fixing the outer peripheral surface of the hose with a clamp.

Figure 7B:
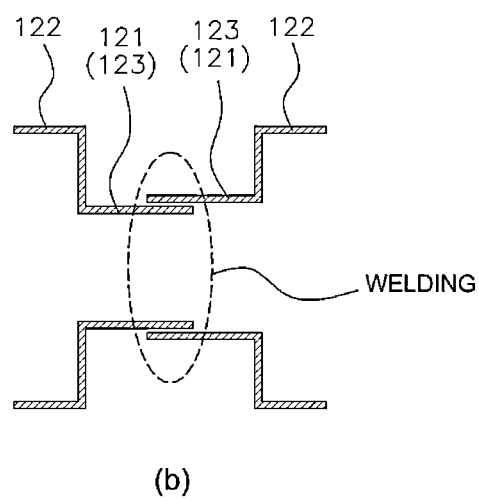

FIG. 7(B) illustrates a cooling water passage connecting method by welding. According to this method, the cooling water inlet 121 and the cooling water outlet 123 have different diameters, and as a result, the cooling water inlet (alternatively, the cooling water outlet) is inserted into the cooling water outlet (alternatively, the cooling water inlet) and both sides are welded to connect two cooling water passages 122.

Figure 7C:
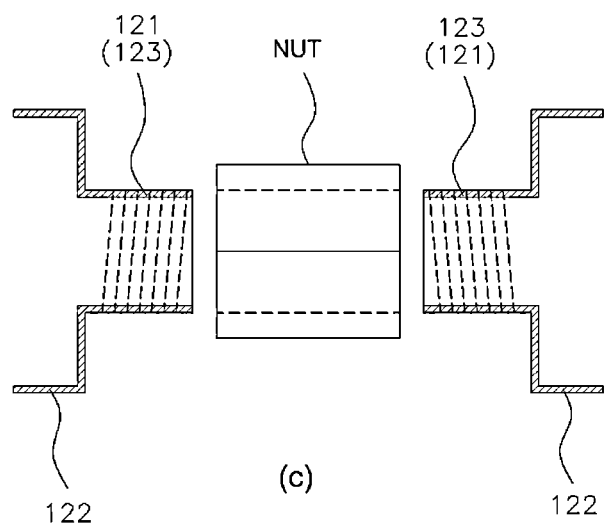

FIG. 7(C) illustrates a cooling water passage connection method by a screw. According to this method, different-direction screws are formed on the outer peripheral surfaces of the cooling water inlet 121 and the cooling water outlet 123.

For example, when a right-handed screw is formed on the outer peripheral surface of the cooling water inlet 121, a left-handed screw is formed on the outer peripheral surface of the cooling water outlet 123. The outer peripheral surfaces of the cooling water inlet 121 and the cooling water outlet 123 are coupled to each other by a nut. Both the left-handed screw and the right-handed screw are formed at the nuts, and as a result, the cooling water inlet 121 and the cooling water outlet 123 are coupled to each other by just rotating the nut.

Figure 7D:
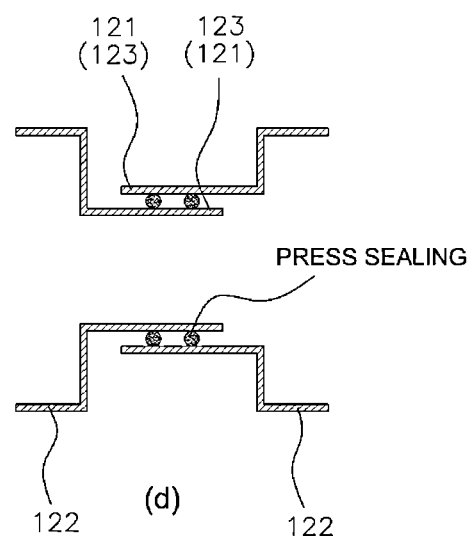

FIG. 7(D) illustrates a cooling water passage connection method by sealing. In this method, the cooling water inlet 121 and the cooling water outlet 123 have different diameters. The cooling water inlet 121 is smaller than the cooling water outlet 123 in diameter or otherwise. The cooling water inlet (alternatively, the cooling water outlet) is inserted into the cooling water outlet (alternatively, the cooling water inlet) and one or more press sealing is pressed therebetween to connect the cooling water inlet and the cooling water outlet to each other.

Figure 7E:
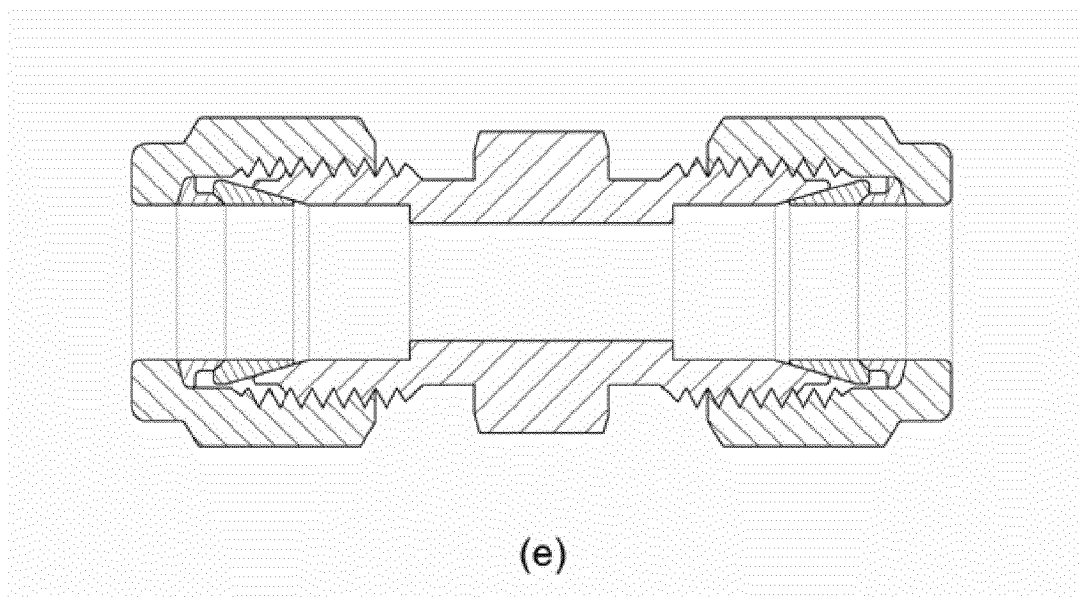

Lastly, FIG. 7(E) illustrates a cooling water passage connecting method by a fitting union. In this case, the cooling water inlet and the cooling water outlet may be simply connected to each other by using the fitting union.

The thermoelectric module 130 is acquired by bonding a P-type semiconductor and an N-type semiconductor, and is manufactured in a circular shape, which has an opening portion 132 of which one side is opened. A pair of thermoelectric modules 130 is attached to both surfaces of one cooling water passage 122 of the low-temperature part 120 and the pair of heat transfer plates 114 are positioned on an outer surface thereof. The plurality of thermoelectric modules 130 is electrically connected to a battery of the vehicle while the thermoelectric modules 130 are electrically connected to each other.

Outer surfaces of the plurality of thermoelectric modules 130 contact inner surfaces of the plurality of pairs of heat transfer plates 114. The components are installed as above, and as a result, the outer surfaces of the thermoelectric modules 130 are heated by the plurality of heat transfer plates 114 and the outer surfaces are cooled by the plurality of cooling water passages 122. Therefore, a difference in temperature occurs between both surfaces of the thermoelectric module 130 and the thermoelectric phenomenon occurs in the plurality of thermoelectric modules 130 by the difference in temperature to produce electricity. The produced electricity charges the battery electrically connected with the plurality of thermoelectric modules 130.

An operation of the thermoelectric generator 100 of a vehicle according to various embodiments of the present invention described above will be described.

When the engine is driven, the exhaust gas is discharged from the engine and flows in the exhaust pipe 112 and in this case, the bypass valve 116 closes the bypass pipe 114. Meanwhile, the cooling water circulated by the cooling system of the engine is introduced into the cooling water inlet 121 of the cooling water passage 112 positioned at an outermost side to circulate in the cooling water inlet 121 and circulates in the other cooling water passage 122 connected by the cooling water passage connecting unit 124.

The exhaust gas exchanges heat with the exhaust pipe 112 while circulating in the exhaust pipe 112 to heat the exhaust pipe 112. The heat transfer plate 114 installed on the outer peripheral surface of the exhaust pipe 112 is heated by the heated exhaust pipe 112 and the thermal energy of the exhaust gas is transferred to the plurality of thermoelectric modules 130 by the heated heat transfer plate 114 to heat the outer surfaces of the plurality of thermoelectric modules 130.

Meanwhile, the cooling water introduced through the cooling water inlet 121 circulates in the plurality of cooling water passages 122 connected by the cooling water passage connecting unit 124. Inner surfaces of the plurality of thermoelectric modules 130 are cooled by the cooling water that circulates.

Therefore, a difference in temperature occurs between both surfaces of the plurality of thermoelectric modules 130 arranged on the outer peripheral surface of the exhaust pipe 112 at a predetermined interval. Electricity is generated inside the plurality of thermoelectric modules 130 by the difference in temperature. The electricity produced by the plurality of thermoelectric modules 130 charges the battery electrically connected to the plurality of thermoelectric modules 130.

When the speed of the vehicle is increased, that is, when the load of the engine is increased, the bypass valve 116 opens the bypass pipe 117 over elastic force of the spring 118. The bypass pipe 117 is opened, and as a result, most of the exhaust gas is exhausted through the bypass pipe 117 and the rest thereof circulates between the bypass pipe 117 and the exhaust pipe 112. The heat-exchange mesh 111 interposed between the bypass pipe 117 and the exhaust pipe 112 exchanges heat with the exhaust gas to heat the exhaust pipe 112 and a subsequent operation is similar as that in the case where the bypass valve 116 is closed. Therefore, a description thereof will be omitted.

As such, according to the thermoelectric generator of a vehicle of the present invention, since the structure thereof is simple and the number of parts is small, a manufacturing cost is reduced and productivity is improved. The thermoelectric generator of a vehicle is easily mounted on the vehicle and may be applied to various vehicles.

For convenience in explanation and accurate definition in the appended claims, the terms left or right, and etc. are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A thermoelectric generator of a vehicle, comprising:
   a high-temperature part including an exhaust pipe heated by exchange heat with exhaust gas while high-temperature exhaust gas passes therein and a plurality of pairs of heat transfer plates mounted on an outer peripheral surface of the exhaust pipe at a predetermined interval and heated by the exhaust pipe;
   a plurality of pairs of thermoelectric modules acquired by bonding a P-type semiconductor and an N-type semiconductor, interposed between the plurality of pairs of heat transfer plates to generate electricity by using a thermoelectric phenomenon, and electrically connected to each other; and
   a low-temperature part interposed between the plurality of pairs of thermoelectric modules and cooling inner surfaces of the plurality of pairs of thermoelectric modules by cooling water that flows therein,
   wherein the plurality of thermoelectric modules generates electricity by using the thermoelectric phenomenon in response to a difference in temperature between outer surfaces heated by the plurality of pairs of heat transfer plates and inner surfaces cooled by the low-temperature part,
   wherein the low-temperature part includes:
   a plurality of circular cooling water passages interposed between the plurality of pairs of thermoelectric modules, in which the cooling water flows therein, and each of the plurality of circular cooling water passages having a cooling water inlet through which the cooling water is introduced and a cooling water outlet through which the cooling water is discharged, wherein the cooling water inlet is formed at a first surface and a first side of each respective circular cooling water passage and the cooling water outlet is formed at a second surface and a second side of the respective circular cooling water passage, wherein the second surface is opposite to the first surface and the second side is opposite to the first side; and
   a cooling water passage connecting unit connecting the cooling water inlet of an adjacent cooling water passage and the cooling water outlet of the other adjacent cooling water passage among the plurality of cooling water passages.

2. The thermoelectric generator of a vehicle of claim 1, wherein the cooling water passage connecting unit includes:
   a hose mounted on outer peripheral surfaces of the cooling water inlet and the cooling water outlet; and
   a clamp pressing the hose.

3. The thermoelectric generator of a vehicle of claim 1, wherein the cooling water passage connecting unit is acquired by welding the cooling water inlet of one adjacent cooling water passage and the cooling water outlet of the other one adjacent cooling water passage.

4. The thermoelectric generator of a vehicle of claim 1, wherein the cooling water passage connecting unit includes:
   a left-handed screw formed at the cooling water inlet of one adjacent cooling water passage;
   a right-handed screw formed at the cooling water outlet of the other one adjacent cooling water passage; and
   a connection nut connecting the cooling water inlet and the cooling water outlet by screw-coupling.

5. The thermoelectric generator of a vehicle of claim 1, wherein the cooling water passage connecting unit includes a press sealing interposed between the cooling water outlet of the other one adjacent cooling water passage having a larger diameter than the cooling water inlet of one adjacent cooling water passage.

6. The thermoelectric generator of a vehicle of claim 1, wherein the cooling water passage connecting unit includes a fitting union connecting the cooling water inlet of one adjacent cooling water passage and the cooling water outlet of the other one adjacent cooling water passage.

* * * * *